(12) United States Patent
Mori

(10) Patent No.: US 12,355,417 B2
(45) Date of Patent: Jul. 8, 2025

(54) FILTER

(71) Applicant: TDK CORPORATION, Tokyo (JP)

(72) Inventor: Naoyuki Mori, Tokyo (JP)

(73) Assignee: TDK CORPORATION, Tokyo (JP)

( * ) Notice: Subject to any disclaimer, the term of this patent is extended or adjusted under 35 U.S.C. 154(b) by 298 days.

(21) Appl. No.: 18/167,473

(22) Filed: Feb. 10, 2023

(65) Prior Publication Data

US 2023/0268902 A1  Aug. 24, 2023

(30) Foreign Application Priority Data

Feb. 21, 2022  (JP) .................. 2022-024551

(51) Int. Cl.
*H03H 7/01* (2006.01)
*H03H 1/00* (2006.01)

(52) U.S. Cl.
CPC ........ *H03H 7/0115* (2013.01); *H03H 7/0161* (2013.01); *H03H 7/1775* (2013.01); *H03H 2001/0085* (2013.01)

(58) Field of Classification Search
CPC ............... H03H 7/1775; H03H 7/0115; H03H 2001/0085; H03H 7/175
USPC .................................................. 333/175, 185
See application file for complete search history.

(56) References Cited

U.S. PATENT DOCUMENTS

| 9,882,541 B2 * | 1/2018 | Watanabe ............ H03H 7/1775 |
| 2010/0109805 A2 | 5/2010 | Achour |
| 2021/0257984 A1 | 8/2021 | Sato et al. |
| 2022/0231655 A1 | 7/2022 | Ogawa |

FOREIGN PATENT DOCUMENTS

| JP | S57-097715 A | 6/1982 |
| JP | 2008-167157 A | 7/2008 |
| JP | 2008-245084 A | 10/2008 |
| JP | 2021-129274 A | 9/2021 |
| WO | 2021/111761 A1 | 6/2021 |

OTHER PUBLICATIONS

Apr. 22, 2025 Office Action issued in Japanese Patent Application No. 2022-024551.

* cited by examiner

*Primary Examiner* — Rakesh B Patel
(74) *Attorney, Agent, or Firm* — Oliff PLC

(57) ABSTRACT

A filter includes a first port, a second port, and a high-pass filter provided between the first port and the second port in a circuit configuration. The high-pass filter includes a first capacitive element provided in a path connecting the first port and the second port, an inductor provided between the path and the ground, and a second capacitive element connected in parallel with the inductor.

10 Claims, 15 Drawing Sheets

FILTER

CROSS REFERENCE TO RELATED APPLICATIONS

This application claims the benefit of Japanese Priority Patent Application No. 2022-024551 filed on Feb. 21, 2022, the entire contents of which are incorporated herein by reference.

BACKGROUND OF THE INVENTION

1. Field of the Invention

The present invention relates to a filter including a high-pass filter.

2. Description of the Related Art

Compact mobile communication apparatuses are generally configured to use a single common antenna for a plurality of applications that use different systems and have different service frequency bands, and to use a branching filter to separate from each other a plurality of signals received and transmitted by the antenna.

A branching filter for separating from each other a first signal of a frequency within a first frequency band and a second signal of a frequency within a second frequency band higher than the first frequency band typically includes a common port, a first signal port, a second signal port, a first filter provided in a first signal path leading from the common port to the first signal port, and a second filter provided in a second signal path leading from the common port to the second signal port.

As the second filter, a high-pass filter or a band-pass filter constituted by a combination of a high-pass filter and a low-pass filter is used, for example. The high-pass filter is constituted by inductors and capacitors, for example.

JP 2008-167157 A1 discloses a high-pass filter including a first capacitor connected between input and output terminals, a first coil and a second capacitor serially connected between the input side of the first capacitor and the ground, and a second coil and a third capacitor serially connected between the output side of the first capacitor and the ground. In this high-pass filter, floating capacitance is generated in parallel with each of the first and second coils.

The recent market demands for reductions in size and footprint of the compact mobile communication apparatuses and also demands for miniaturization of branching filters for use in those communication apparatuses. Reducing an inductor in size along with such miniaturization of a branching filter results in reducing inductance of the inductor. This case has a problem that a desired resonance frequency is not obtained in a high-pass filter. However, an attempt to increase the inductance of an inductor without increasing a branching filter in size causes a problem that the widths of conductor layers and the diameters of through holes constituting the inductor are reduced and a Q value of the inductor is consequently reduced.

SUMMARY OF THE INVENTION

An object of the present invention is to provide a filter including a high-pass filter, the filter being capable of increasing a Q value of an inductor while satisfying desired characteristics.

A filter according to the present invention includes a first port, a second port, and at least one high-pass filter provided between the first port and the second port in a circuit configuration. The at least one high-pass filter includes a first capacitive element provided in a path connecting the first port and the second port, an inductor provided between the path and ground, and a second capacitive element connected in parallel with the inductor.

In the filter according the present invention, a first resonance frequency of a serial circuit including the inductor and a capacitor that corresponds to the first capacitive element and a second resonance frequency of a parallel circuit including the inductor and the second capacitive element may be different from each other. The second resonance frequency may be higher than the first resonance frequency.

In the filter according to the present invention, the at least one high-pass filter may include a plurality of high-pass filters.

The filter according to the present invention may further include a low-pass filter provided between the first port or the second port and the at least one high-pass filter in a circuit configuration.

The filter according to the present invention may further include a stack including a plurality of dielectric layers and a plurality of conductor layers stacked together. The first port, the second port, and the at least one high-pass filter may be integrated with the stack. The plurality of conductor layers may include a plurality of capacitor conductor layers for constituting the first capacitive element and the second capacitive element. The inductor may be wound about an axis orthogonal to the plurality of dielectric layers.

When the filter according to the present invention includes the stack, the stack may further include at least one first through hole line and at least one second through hole line. Each of the at least one first through hole line and the at least one second through hole line may be constituted by two or more through holes connected in series to each other. The plurality of conductor layers may include an inductor conductor layer connecting one end of the at least one first through hole line and one end of the at least one second through hole line. The inductor may be constituted by the inductor conductor layer, the at least one first through hole line, and the at least one second through hole line. The at least one first through hole line may include two first through hole lines, and the at least one second through hole line may include two second through hole lines.

When the filter according to the present invention includes the stack, the at least one high-pass filter may include a first high-pass filter and a second high-pass filter. In this case, the stack may include a first side surface and a second side surface located at both ends in a direction orthogonal to a stacking direction of the plurality of dielectric layers. The inductor of the first high-pass filter may be arranged at a position closer to the first side surface than the second side surface. The inductor of the second high-pass filter may be arranged at a position closer to the second side surface than the first side surface.

In the filter of the present invention, the at least one high-pass filter includes a first capacitive element provided in a path connecting the first port and the second port, an inductor provided between the path and ground, and a second capacitive element connected in parallel with the inductor. With these, according to the present invention, it is possible to provide a filter that can increase a Q value of an inductor while satisfying desired characteristics.

Other and further objects, features, and advantages of the present invention will appear more fully from the following description.

DETAILED DESCRIPTION OF THE PREFERRED EMBODIMENTS

First Embodiment

Figure 1:
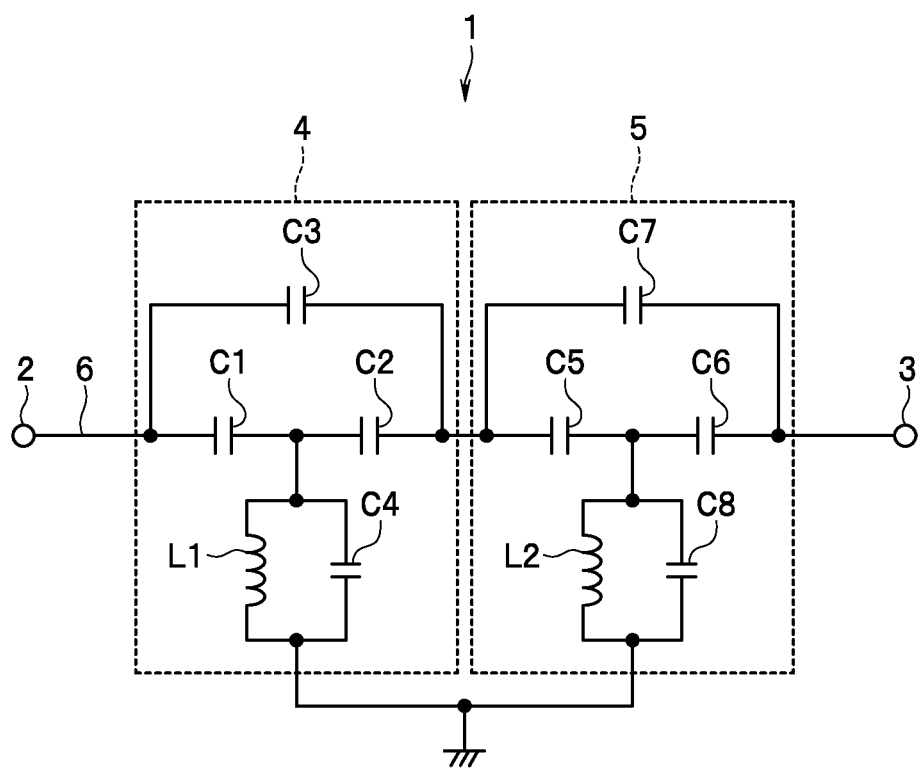
FIG. 1 is a circuit diagram showing a circuit configuration of a filter according to a first embodiment of the present invention.

An embodiment of the present invention will now be described in detail with reference to the drawings. First, reference is made to FIG. 1 to describe a configuration of a filter 1 according to a first embodiment of the present invention. FIG. 1 is a circuit diagram showing a circuit configuration of the filter 1.

The filter 1 according to the present embodiment includes a first port 2, a second port 3, and at least one high-pass filter provided between the first port 2 and the second port 3 in a circuit configuration. In the present embodiment, in particular, the filter 1 is a higher order high-pass filter including a plurality of high-pass filters connected in series to each other and configured to selectively pass a signal of a frequency in a passband of a predetermined cutoff frequency or above. Note that, in the present application, the expression of "in the(a) circuit configuration" is used to indicate not layout in physical configuration but layout in the circuit diagram.

As shown in FIG. 1, the filter 1 includes two third-order high-pass filters 4 and 5 connected in series to each other, as at least one high-pass filter. The high-pass filters 4 and 5 are arranged in this order from the first port 2 side in the circuit configuration.

The filter 1 includes a path 6 connecting the first port 2 and the second port 3 and not connected to the ground. The high-pass filter 4 includes first capacitive elements C1, C2, and C3 provided in the path 6, an inductor L1 provided between the path 6 and the ground, and a second capacitive element C4 connected in parallel with the inductor L1. Note that the "capacitive element" is a capacitor that is not floating capacitance and is provided intentionally. The first capacitive elements C1 and C2 are provided in series in the path 6. The first capacitive element C3 is provided in parallel with the path 6.

The configuration of the high-pass filter 5 is the same as that of the high-pass filter 4. Specifically, the high-pass filter 5 includes first capacitive elements C5, C6, and C7 provided in the path 6, an inductor L2 provided between the path 6 and the ground, and a second capacitive element C8 connected in parallel with the inductor L2. The first capacitive elements C5 and C6 are provided in series in the path 6. The first capacitive element C7 is provided in parallel with the path 6.

A detailed description will now be given of a relationship of connection of a plurality of components constituting the filter 1, with reference to FIG. 1. One end of the first capacitive element C1 is connected to the first port 2. One end of the first capacitive element C2 is connected to the other end of the first capacitive element C1. One end of the first capacitive element C3 is connected to the one end of the first capacitive element C1. The other end of the first capacitive element C3 is connected to the other end of the first capacitive element C2.

One end of the inductor L1 is connected to a connection point between the first capacitive element C1 and the first capacitive element C2. The other end of the inductor L1 is connected to the ground. The second capacitive element C4 is connected in parallel with the inductor L1.

One end of the first capacitive element C5 is connected to the other end of the first capacitive element C2. One end of the first capacitive element C6 is connected to the other end of the first capacitive element C5. The other end of the first capacitive element C6 is connected to the second port 3. One end of the first capacitive element C7 is connected to the one end of the first capacitive element C5. The other end of the first capacitive element C7 is connected to the other end of the first capacitive element C6.

One end of the inductor L2 is connected to a connection point between the first capacitive element C5 and the first capacitive element C6. The other end of the inductor L2 is connected to the ground. The second capacitive element C8 is connected in parallel with the inductor L2.

In FIG. 1, the first capacitive elements C1 to C3 are connected to each other in delta (Δ) connection. By converting the connection of the first capacitive elements C1 to C3 from the delta (Δ) connection to star (Y) connection, a first serial circuit constituted by capacitors corresponding to the first capacitive elements and the inductor L1 is formed between the path 6 and the ground. Each of the resonance frequency of the first serial circuit and the resonance frequency of a first parallel circuit constituted by the inductor L1 and the second capacitive element C4 is set at a predetermined value according to design values, such as the cutoff frequency and the passband, of the filter 1. The resonance frequency of the first serial circuit and the resonance frequency of the first parallel circuit may be different from each other. The resonance frequency of the first parallel circuit may be higher than the resonance frequency of the first serial circuit.

Similarly, in FIG. 1, the first capacitive elements C5 to C7 are connected to each other in the delta (Δ) connection. By converting the connection of the first capacitive elements C5 to C7 from the delta (Δ) connection to the star (Y) connection, a second serial circuit constituted by capacitors corresponding to the first capacitive elements and the inductor L2 is formed between the path 6 and the ground. Each of the resonance frequency of the second serial circuit and the resonance frequency of a second parallel circuit constituted by the inductor L2 and the second capacitive element C8 is set at a predetermined value according to design values, such as the cutoff frequency and the passband, of the filter 1. The resonance frequency of the second serial circuit and the resonance frequency of the second parallel circuit may be different from each other. The resonance frequency of the second parallel circuit may be higher than the resonance frequency of the second serial circuit.

Figure 2:
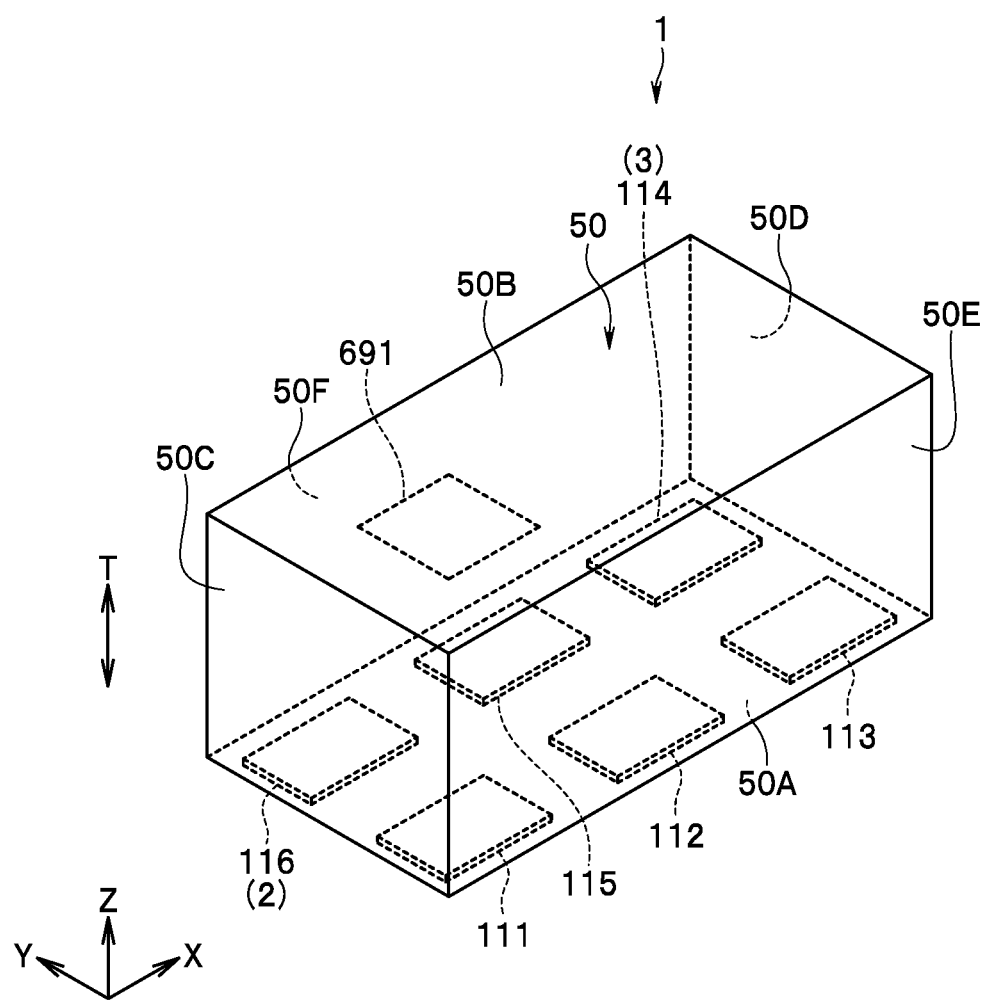
FIG. 2 is a perspective view showing an external appearance of the filter according to the first embodiment of the present invention.

Next, other configurations of the filter 1 will be described with reference to FIG. 2. FIG. 2 is a perspective view showing an external appearance of the filter 1. The filter 1 further includes a stack 50 including a plurality of dielectric layers and a plurality of conductor layers stacked together. The first port 2, the second port 3, and the high-pass filters 4 and 5 shown in FIG. 1 are integrated with the stack 50.

The stack 50 has a bottom surface 50A and a top surface 50B located at both ends in a stacking direction T of the plurality of dielectric layers, and four side surfaces 50C to 50F connecting the bottom surface 50A and the top surface 50B. The side surfaces 50C and 50D are opposite to each other. The side surfaces 50E and 50F are opposite to each other. The side surfaces 50C to 50F are perpendicular to the top surface 50B and the bottom surface 50A.

Here, X, Y, and Z directions are defined as shown in FIG. 2. The X, Y, and Z directions are orthogonal to one another. In the present embodiment, a direction parallel to the stacking direction T will be referred to as the Z direction. The opposite directions to the X, Y, and Z directions are defined as −X, −Y, and −Z directions, respectively.

As shown in FIG. 2, the bottom surface 50A is located at the end of the stack 50 in the −Z direction. The top surface 50B is located at the end of the stack 50 in the Z direction. The bottom surface 50A and the top surface 50B each have a rectangular shape extending in the X direction. The side surface 50C is located at the end of the stack 50 in the −X direction. The side surface 50D is located at the end of the stack 50 in the X direction. The side surface 50E is located at the end of the stack 50 in the −Y direction. The side surface 50F is located at the end of the stack 50 in the Y direction.

The filter 1 further includes six terminals 111, 112, 113, 114, 115, and 116 provided on the bottom surface 50A of the stack 50. The terminals 111, 112, and 113 are arranged in this order in the X direction at positions closer to the side surface 50E than the side surface 50F. The terminals 114, 115, and 116 are arranged in this order in the −X direction at positions closer to the side surface 50F than the side surface 50E.

The terminal 116 corresponds to the first port 2, and the terminal 114 corresponds to the second port 3. Thus, the first and second ports 2 and 3 are provided on the bottom surface 50A of the stack 50. The terminals 111 to 113 and 115 are connected to the ground.

Next, an example of the plurality of dielectric layers and the plurality of conductor layers constituting the stack 50 will be described with reference to FIG. 3A to FIG. 5C. In this example, the stack 50 includes nineteen dielectric layers stacked together. In the following, the nineteen dielectric layers will be referred to as the first to nineteenth dielectric layers in the order from bottom to top. The first to nineteenth dielectric layers are denoted by reference numerals 51 to 69, respectively.

Figure 3A:
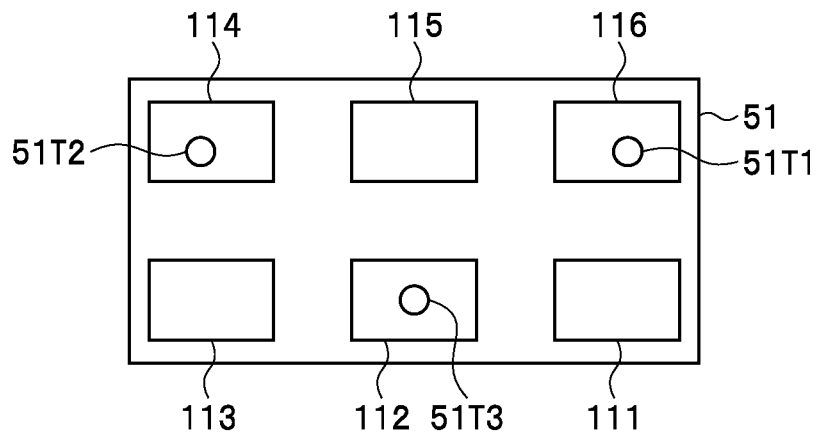
FIG. 3A to FIG. 3C are explanatory diagrams showing respective patterned surfaces of first to third dielectric layers of a stack of the filter according to the first embodiment of the present invention.

FIG. 3A shows the patterned surface of the first dielectric layer 51. The terminals 111 to 116 are formed on the patterned surface of the dielectric layer 51. Further, through holes 51T1, 51T2, and 51T3 are formed in the dielectric layer 51. The through hole 51T1 is connected to the terminal 116. The through hole 51T2 is connected to the terminal 114. The through hole 51T3 is connected to the terminal 112.

Figure 3B:
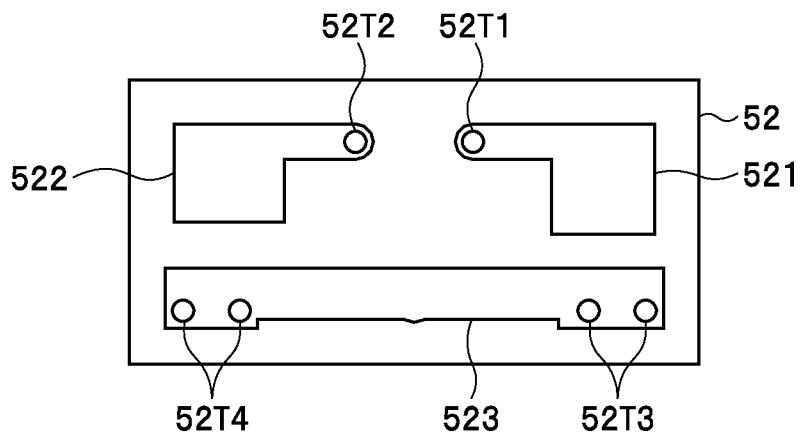

FIG. 3B shows the patterned surface of the second dielectric layer 52. Conductor layers 521, 522, and 523 are formed on the patterned surface of the dielectric layer 52. Further, through holes 52T1 and 52T2, two through holes 52T3, and two through holes 52T4 are formed in the dielectric layer 52. The through hole 51T1 formed in the dielectric layer 51 and the through hole 52T1 are connected to the conductor layer 521. The through hole 51T2 formed in the dielectric layer 51 and the through hole 52T2 are connected to the conductor layer 522. The through hole 51T3 formed in the dielectric layer 51 and the through holes 52T3 and 52T4 are connected to the conductor layer 523.

Figure 3C:
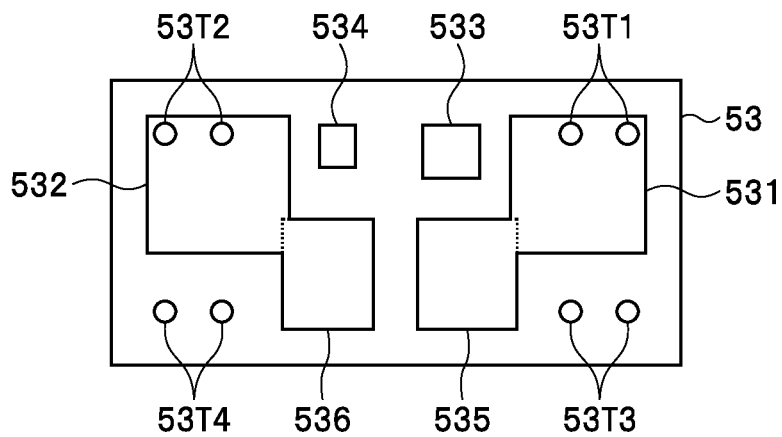

FIG. 3C shows the patterned surface of the third dielectric layer 53. Conductor layers 531, 532, 533, 534, 535, and 536 are formed on the patterned surface of the dielectric layer 53. The conductor layer 531 is connected to the conductor layer 535. The conductor layer 532 is connected to the conductor layer 536. In FIG. 3C, each of the boundary between the conductor layer 531 and the conductor layer 535 and the boundary between the conductor layer 532 and the conductor layer 536 is indicated by a dotted line. The through holes 52T1 and 52T2 formed in the dielectric layer 52 are connected to the conductor layers 533 and 534, respectively.

Further, two through holes 53T1, two through holes 53T2, two through holes 53T3, and two through holes 53T4 are formed in the dielectric layer 53. The through holes 53T1 are connected to the conductor layer 531. The through holes 53T2 are connected to the conductor layer 532. The through holes 52T3 and 52T4 formed in the dielectric layer 53 are connected to the through holes 53T3 and 53T4, respectively.

Figure 4A:
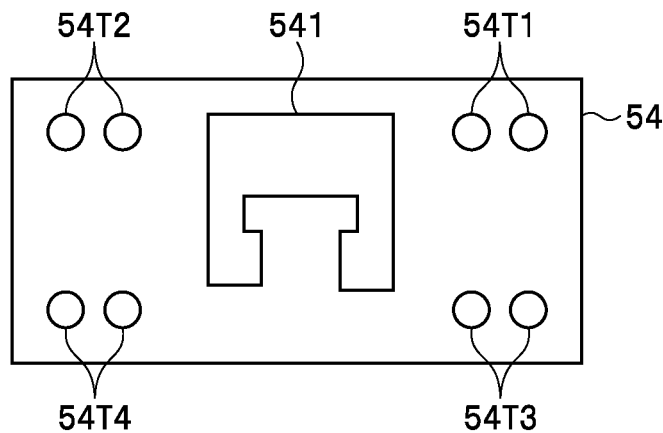
FIG. 4A is an explanatory diagram showing a patterned surface of a fourth dielectric layer of the stack of the filter according to the first embodiment of the present invention.

FIG. 4A shows the patterned surface of the fourth dielectric layer 54. A conductor layer 541 is formed on the patterned surface of the dielectric layer 54. Further, two through holes 54T1, two through holes 54T2, two through holes 54T3, and two through holes 54T4 are formed in the dielectric layer 54. The through holes 53T1 to 53T4 formed in the dielectric layer 53 are connected to the through holes 54T1 to 54T4, respectively.

Figure 4B:
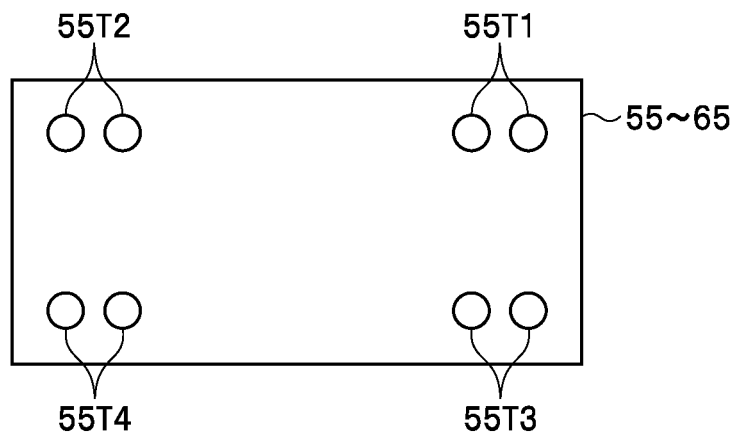
FIG. 4B is an explanatory diagram showing respective patterned surfaces of fifth to fifteenth dielectric layers of the stack of the filter according to the first embodiment of the present invention.

FIG. 4B shows the patterned surface of each of the fifth to fifteenth dielectric layers 55 to 65. Two through holes 55T1, two through holes 55T2, two through holes 55T3, and two through holes 55T4 are formed in each of the dielectric layers 55 to 65. The through holes 54T1 to 54T4 formed in the dielectric layer 54 are connected to the through holes 55T1 to 55T4 formed in the dielectric layer 55, respectively. In the dielectric layers 55 to 65, every vertically adjacent through holes denoted by the same reference signs are connected to each other.

Figure 4C:
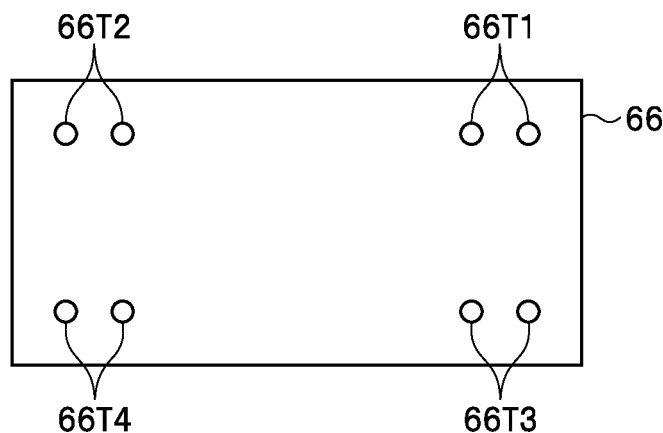
FIG. 4C is an explanatory diagram showing a patterned surface of a sixteenth dielectric layer of the stack of the filter according to the first embodiment of the present invention.

FIG. 4C shows the patterned surface of the sixteenth dielectric layer 66. Two through holes 66T1, two through holes 66T2, two through holes 66T3, and two through holes 66T4 are formed in the dielectric layer 66. The through holes 55T1 to 55T4 formed in the dielectric layer 65 are connected to the through holes 66T1 to 66T4, respectively.

Figure 5A:
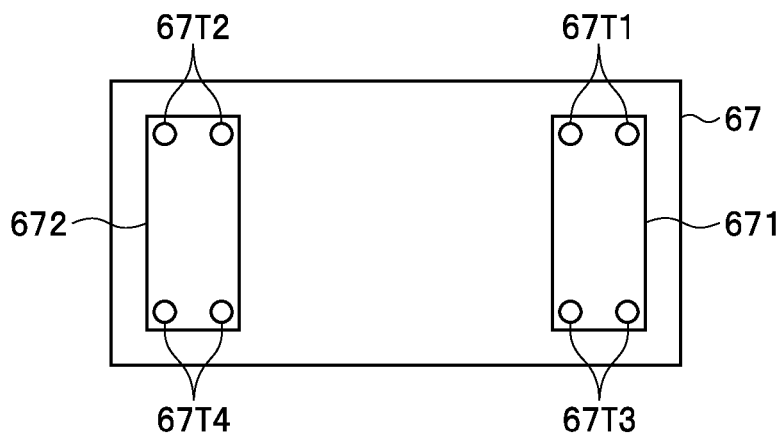
FIG. 5A to FIG. 5C are explanatory diagrams showing respective patterned surfaces of seventeenth to nineteenth dielectric layers of the stack of the filter according to the first embodiment of the present invention.

FIG. 5A shows the patterned surface of the seventeenth dielectric layer 67. Inductor conductor layers 671 and 672 are formed on the patterned surface of the dielectric layer 67. Each of the conductor layers 671 and 672 has a first end and a second end located opposite to each other.

Further, two through holes 67T1, two through holes 67T2, two through holes 67T3, and two through holes 67T4 are formed in the dielectric layer 67. The through holes 66T1 formed in the dielectric layer 66 and the through holes 67T1 are connected to a portion near the first end of the conductor layer 671. The through holes 66T2 formed in the dielectric layer 66 and the through holes 67T2 are connected to a portion near the first end of the conductor layer 672. The through holes 66T3 formed in the dielectric layer 66 and the through holes 67T3 are connected to a portion near the second end of the conductor layer 671. The through holes 66T4 formed in the dielectric layer 66 and the through holes 67T4 are connected to a portion near the second end of the conductor layer 672.

Figure 5B:

FIG. 5B shows the patterned surface of the eighteenth dielectric layer 68. Inductor conductor layers 681 and 682 are formed on the patterned surface of the dielectric layer 68. Each of the conductor layers 681 and 682 has a first end and a second end located opposite to each other. The through holes 67T1 formed in the dielectric layer 67 are connected to a portion near the first end of the conductor layer 681. The through holes 67T2 formed in the dielectric layer 67 are connected to a portion near the first end of the conductor layer 682. The through holes 67T3 formed in the dielectric layer 67 are connected to a portion near the second end of the conductor layer 681. The through holes 67T4 formed in the dielectric layer 67 are connected to a portion near the second end of the conductor layer 682.

Figure 5C:
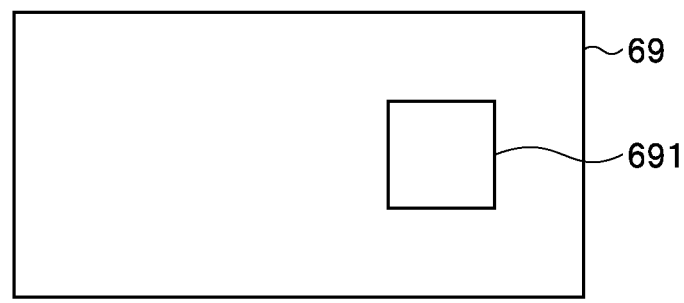

FIG. 5C shows the patterned surface of the nineteenth dielectric layer 69. A mark 691 made of a conductor layer is formed on the patterned surface of the dielectric layer 69.

The stack 50 shown in FIG. 2 is formed by stacking the first to nineteenth dielectric layers 51 to 69 such that the patterned surface of the first dielectric layer 51 serves as the bottom surface 50A of the stack 50 and the surface of the nineteenth dielectric layer 69 opposite to the patterned surface thereof serves as the top surface 50B of the stack 50.

Figure 6:
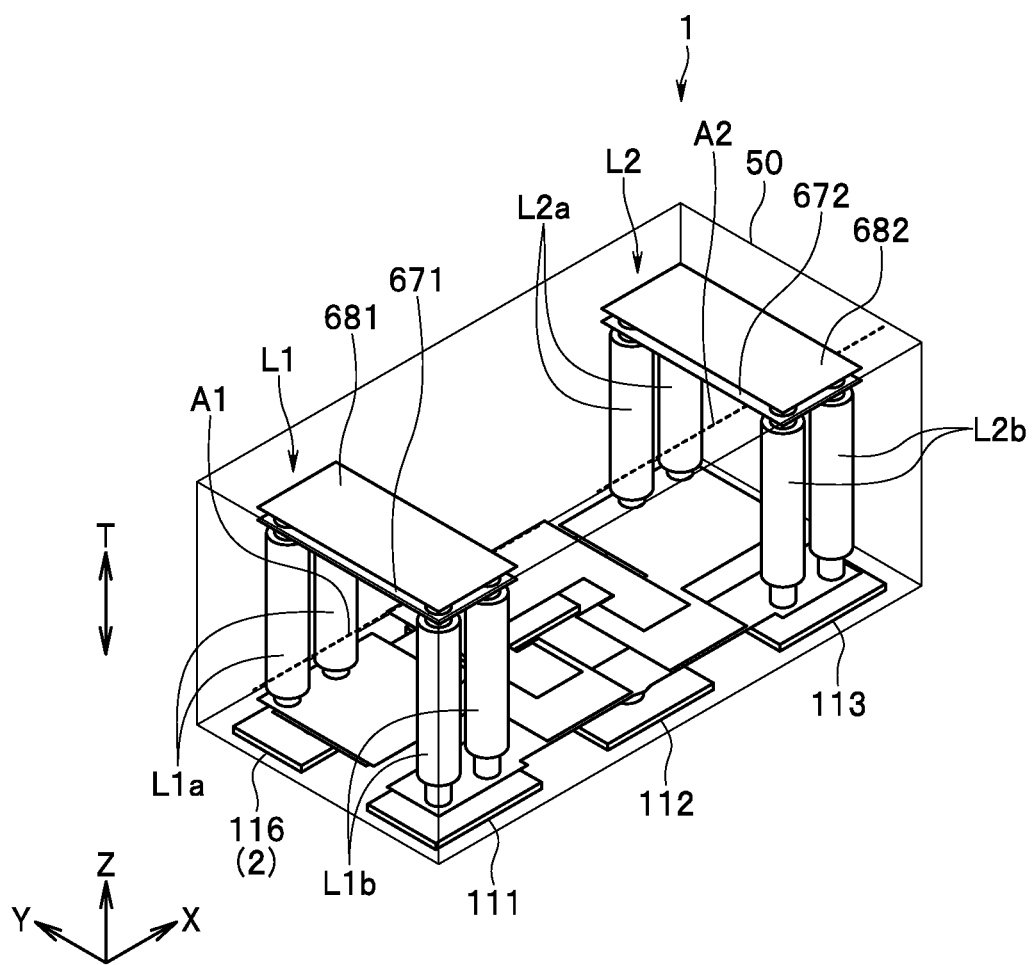
FIG. 6 is a perspective view showing an internal structure of the stack of the filter according to the first embodiment of the present invention.

FIG. 6 shows the internal structure of the stack 50 formed by stacking the first to nineteenth dielectric layers 51 to 69. As shown in FIG. 6, the plurality of conductor layers and the plurality of through holes shown in FIG. 3A to 5B are stacked inside the stack 50. Note that FIG. 6 omits the mark 691.

Correspondences between the components of the filter 1 shown in FIG. 1 and the internal components of the stack 50 shown in FIG. 3A to FIG. 5B will now be described. First, components of the high-pass filter 4 will be described. The inductor L1 is constituted by the inductor conductor layers 671 and 681, and the through holes 52T3, 53T1, 53T3, 54T1, 54T3, 55T1, 55T3, 66T1, and 66T3.

The first capacitive element C1 is constituted by the conductor layers 521 and 531 and the dielectric layer 52 interposed between those conductor layers. The first capacitive element C2 is constituted by the conductor layers 535 and 541, and the dielectric layer 53 interposed between those conductor layers. The first capacitive element C3 is constituted by the conductor layers 533 and 541, and the dielectric layer 53 interposed between those conductor layers. The second capacitive element C4 is constituted by the conductor layers 523 and 535, and the dielectric layer 52 interposed between those conductor layers.

Next, components of the high-pass filter 5 will be described. The inductor L2 is constituted by the inductor conductor layers 672 and 682, and the through holes 52T4, 53T2, 53T4, 54T2, 54T4, 55T2, 55T4, 66T2, and 66T4.

The first capacitive element C5 is constituted by the conductor layers 536 and 541, and the dielectric layer 53 interposed between those conductor layers. The first capacitive element C6 is constituted by the conductor layers 522 and 532, and the dielectric layer 52 interposed between those conductor layers. The first capacitive element C7 is constituted by the conductor layers 534 and 541, and the dielectric layer 53 interposed between those conductor layers. The second capacitive element C8 is constituted by the conductor layers 523 and 536, and the dielectric layer 52 interposed between those conductor layers.

Next, the structural features of the filter 1 according to the present embodiment will be described with reference to FIG. 2 to FIG. 6. The inductor L1 of the high-pass filter 4 and the inductor L2 of the high-pass filter 5 are arranged in a longitudinal direction of the bottom surface 50A or the top surface 50B, i.e., a direction parallel to the X direction. The side surfaces 50C and 50D of the stack 50 are located at both ends of a direction that is orthogonal to the stacking direction T and is parallel to the X direction. The inductor L1 is arranged at a position closer to the side surface 50C than the side surface 50D. The inductor L2 is arranged at a position closer to the side surface 50D than the side surface 50C.

As shown in FIG. 6, the inductor L1 is wound about an axis A1 orthogonal to the stacking direction T. The inductor L2 is wound about an axis A2 orthogonal to the stacking direction T. In the present embodiment, in particular, the axes A1 and A2 extend in a direction parallel to the X direction.

Here, a structure constituted by connecting two or more through holes in series is referred to as a through hole line. The stack 50 includes at least one first through hole line and at least one second through hole line. In the present embodiment, in particular, the stack 50 includes two first through hole lines L1a, two first through hole lines L2a, two second through hole lines L1b, and two second through hole lines L2b.

The two first through hole lines L1a are arranged in line in the X direction near a corner at a position where the side surface 50C and the side surface 50F intersect one another. The two first through hole lines L2a are arranged in line in the X direction near a corner at a position where the side surface 50D and the side surface 50F intersect one another. The two second through hole lines L1b are arranged in line in the X direction near a corner at a position where the side surface 50C and the side surface 50E intersect one another. The two second through hole lines L2b are arranged in line in the X direction near a corner at a position where the side surface 50D and the side surface 50E intersect one another.

The first through hole lines L1a are constituted by the through holes 53T1, 54T1, 55T1, and 66T1 connected in series to each other. The first through hole lines L2a are constituted by the through holes 53T2, 54T2, 55T2, and 66T2 connected in series to each other. The second through hole lines L1b are constituted by the through holes 52T3, 53T3, 54T3, 55T3, and 66T3 connected in series to each other. The second through hole lines L2b are constituted by the through holes 52T4, 53T4, 54T4, 55T4, and 66T4 connected in series to each other.

The inductor conductor layers 671 and 672 each extend in a shorter-side direction of the bottom surface 50A and the top surface 50B, i.e., a direction parallel to the Y direction. The inductor conductor layer 671 connects one ends of the two first through hole lines L1a and one ends of the two second through hole lines L1b. The inductor conductor layer 672 connects one ends of the two first through hole lines L2a and one ends of the two second through hole lines L2b.

The inductor L1 is constituted by the inductor conductor layers 671 and 681, the two first through hole lines L1a, the two second through hole lines L1b, and the through holes 67T1 and 67T3. The inductor L2 is constituted by the inductor conductor layers 672 and 682, the two first through hole lines L2a, and the two second through hole lines L2b, and the through holes 67T2 and 67T4.

The conductor layers 521 to 523, 531 to 536, and 541 correspond to "capacitor conductor layers" in the present invention. When seen from one direction parallel to the stacking direction T, at least part of the capacitor conductor layers are arranged between the inductor L1 and the inductor L2. In the present embodiment, in particular, when seen from one direction parallel to the stacking direction T, the conductor layers 533 to 536 and 541 and part of the conductor layer 523 are arranged between the inductor L1 and the inductor L2.

The operation and effects of the filter 1 according to the present embodiment will now be described. The filter 1 includes the high-pass filter 4. The high-pass filter 4 includes the first capacitive elements C1 to C3, the inductor L2, and the second capacitive element C4. The inductor L2 and the second capacitive element C4 constitute the first parallel circuit.

The impedance of the first parallel circuit is the largest when the frequency is equal to the resonance frequency of the first parallel circuit. Hence, in a circuit with the first parallel circuit inserted between the path connecting two ports and the ground, the power gain, which is the ratio of an output power to an input power, is the highest when the frequency is equal to the resonance frequency of the first parallel circuit.

Reducing the inductor L1 in size along with miniaturization of the stack 50 of the filter 1 results in reducing the inductance of the inductor L1. If an attempt is made to increase the inductance of the inductor L1 without increasing the stack 50 of the filter 1 in size, this causes a problem that the widths of the inductor conductor layers 671 and 681 constituting the inductor L1 and the diameters of the through holes 52T3, 53T1, 53T3, 54T1, 54T3, 55T1, 55T3, 66T1, and 66T3 are reduced and a Q value of the inductor L1 is consequently reduced.

In contrast to this, in the present embodiment, by increasing the capacitance of the second capacitive element C4, it is possible to suppress a reduction of the Q value of the inductor L1 while setting the resonance frequency of the first parallel circuit to a desired value. Specifically, according to the present embodiment, by increasing the capacitance of the second capacitive element C4, it is possible to substantially increase the widths of the inductor conductor layers constituting the inductor L1 and the diameters of the through holes 52T3, 53T1, 53T3, 54T1, 54T3, 55T1, 55T3, 66T1, and 66T3 and consequently reduce the inductance of the inductor L1 and also to increase the Q value of the inductor L1. Hence, according to the present embodiment, it is possible to set the resonance frequency of the first parallel circuit to a predetermined value while increasing the Q value of the inductor L1. As a result, the present embodiment allows the insertion loss of a passband of the high-pass filter 4 to be reduced.

Meanwhile, in the circuit with the first parallel circuit inserted between the path connecting two ports and the ground, the power gain becomes lower as the frequency becomes distant from the resonance frequency of the first parallel circuit. Hence, according to the present embodiment, by setting the resonance frequency of the first parallel circuit to a predetermined value, it is possible to increase pass attenuation in a frequency band on the lower band side than the passband of the high-pass filter 4.

As described above, in the high-pass filter 4, the first serial circuit constituted by the capacitors corresponding to the first capacitive elements and the inductor L1 is constituted. The impedance of the first serial circuit is the smallest when the frequency is equal to the resonance frequency of the first serial circuit. In the circuit with the first serial circuit inserted between the path connecting two ports and the ground, the power gain is the lowest when the frequency is equal to the resonance frequency of the first serial circuit. Hence, according to the present embodiment, by making the resonance frequency of the first serial circuit and the resonance frequency of the first parallel circuit different from each other, the high-pass filter 4 satisfying desired characteristics can be provided. Moreover, according to the present embodiment, by setting the resonance frequency of the first parallel circuit to be higher than the resonance frequency of the first serial circuit, it is possible to reduce insertion loss of the passband of the high-pass filter 4.

In view of the above, according to the present embodiment, it is possible to increase the Q value of the inductor L1 while satisfying desired characteristics.

The filter 1 further includes the high-pass filter 5. The above description of the high-pass filter 4 is also applicable to the high-pass filter 5. Hence, according to the present embodiment, it is possible to increase the Q value of the inductor L2 while satisfying desired characteristics. Consequently, according to the present embodiment, it is possible to reduce the insertion loss of the passband of the filter 1 and also to increase pass attenuation in a frequency band on the lower band side than the passband of the filter 1.

In the present embodiment, the inductor L1 is constituted by the inductor conductor layers 671 and 681, the two first through hole lines L1a, the two second through hole lines L1b, and the through holes 67T1 and 67T3. According to the present embodiment, it is possible to increase the Q value of the inductor L1 compared to a case of including one first through hole line L1a and one second through hole line L1b. Similarly, in the present embodiment, the inductor L2 is constituted by the inductor conductor layers 672 and 682, the two first through hole lines L2a, the two second through hole lines L2b, and the through holes 67T2 and 67T4. According to the present embodiment, it is possible to increase the Q value of the inductor L2 compared to a case of including one first through hole line L2a and one second through hole line L2b.

Next, advantageous effects of the present embodiment will be described with reference to a result of a simulation. In the simulation, a model of the filter 1 according to the present embodiment (referred to as a model of a practical example, below) and a model of a filter of a comparative example where the second capacitive elements C4 and C8 are not provided (referred to as a model of a comparative example, below) were used. The configuration of the filter of the comparative example is the same as the configuration of the filter 1 according to the present embodiment except that the second capacitive elements C4 and C8 are not provided. In the simulation, the model of the practical example and the model of the comparative example were designed so that the cutoff frequency of the model of the practical example and the cutoff frequency of the model of the comparative example would be the same.

Figure 7:
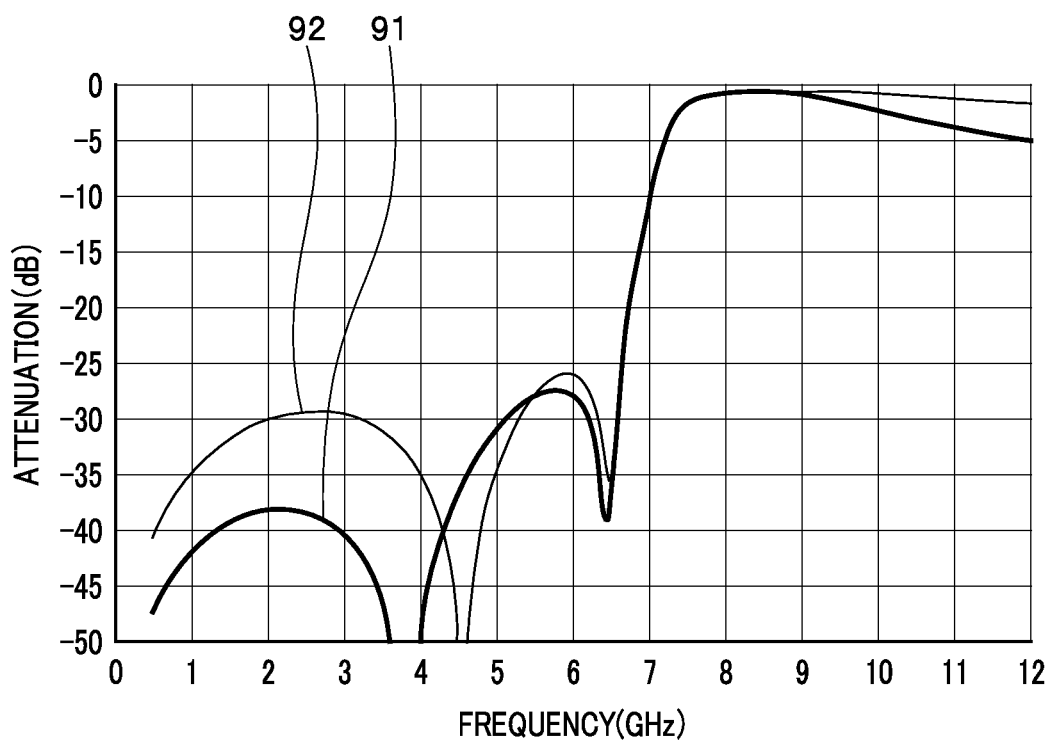
FIG. 7 is a characteristic chart showing pass attenuation characteristics of a model of a practical example and a model of a comparative example.

FIG. 7 is a characteristic chart showing pass attenuation characteristics of the model of the practical example and the model of the comparative example. In FIG. 7, the horizontal axis represents frequency, and the vertical axis represents attenuation. In FIG. 7, the curve denoted by a reference numeral 91 represents characteristics of the model of the practical example, and the curve denoted by a reference numeral 92 represents characteristics of the model of the comparative example. It is seen from FIG. 7 that the absolute value of attenuation in the frequency band on the lower band side than the passband is larger in the model of the practical example (reference numeral 91) than that in the model of the comparative example (reference numeral 92). As understood from this result, according to the present embodiment, by providing the second capacitive elements C4 and C8, it is possible to increase the pass attenuation in the frequency band on the lower band side than the passband.

Moreover, it is seen from FIG. 7 that the model of the practical example (reference numeral 91) and the model of the comparative example (reference numeral 92) each have a sufficiently small absolute value of attenuation in the passband near the cutoff frequency.

Second Embodiment

Figure 8:
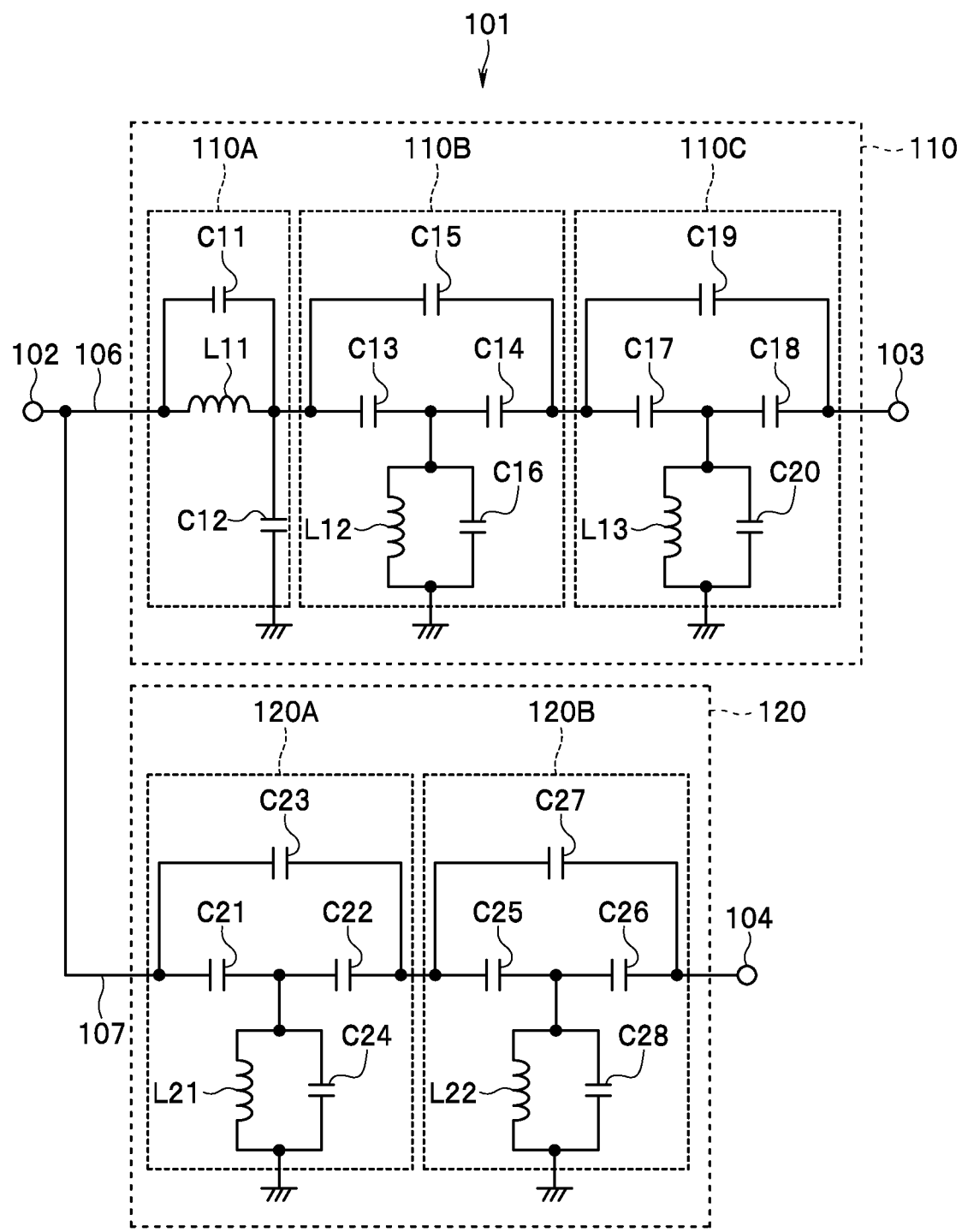
FIG. 8 is a circuit diagram showing a circuit configuration of a branching filter including a filter according to a second embodiment of the present invention.

A second embodiment of the present invention will now be described. First, reference is made to FIG. 8 to describe a configuration of a branching filter 101 in the present embodiment. FIG. 8 is a circuit diagram showing a circuit configuration of the branching filter 101. The branching filter 101 in the present embodiment is a diplexer that includes a band-pass filter 110 configured to selectively pass a signal of a frequency within a first passband and a high-pass filter 120 configured to selectively pass a signal of a frequency within a second passband equal to or higher than a cutoff frequency higher than the first passband.

The branching filter 101 further includes a common port 102 and two signal ports 103 and 104. The band-pass filter 110 is provided between the common port 102 and the signal port 103 in a circuit configuration. The high-pass filter 120 is provided between the common port 102 and the signal port 104 in the circuit configuration.

The common port 102 corresponds to a "first port" of the present invention. The signal ports 103 and 104 each correspond to a "second port" of the present invention. The branching filter 101 includes a path 106 connecting the common port 102 and the signal port 103 and not connected to the ground and a path 107 connecting the common port 102 and the signal port 104 and not connected to the ground.

The band-pass filter 110 includes a low-pass filter 110A and high-pass filters 110B and 110C. The low-pass filter 110A and the high-pass filters 110B and 110C are arranged in this order from the common port 102 side in the circuit configuration.

The low-pass filter 110A includes an inductor L11 provided in the path 106, a capacitive element C11 connected in parallel with the inductor L11, and a capacitive element C12 provided between the path 106 and the ground.

The high-pass filter 110B includes first capacitive elements C13, C14, and C15 provided in the path 106, an inductor L12 provided between the path 106 and the ground, and a second capacitive element C16 connected in parallel with the inductor L12. The first capacitive elements C13 and C14 are provided in series in the path 106. The first capacitive element C15 is provided in parallel with the path 106.

The configuration of the high-pass filter 110C is the same as the configuration of the high-pass filter 110B. Specifically, the high-pass filter 110C includes first capacitive elements C17, C18, and C19 provided in the path 106, an inductor L13 provided between the path 106 and the ground, and a second capacitive element C20 connected in parallel with the inductor L13. The first capacitive elements C17 and C18 are provided in series in the path 106. The first capacitive element C19 is provided in parallel with the path 106.

The high-pass filter 120 includes high-pass filters 120A and 120B. The high-pass filters 120A and 120B are arranged in this order from the common port 102 side in the circuit configuration.

The high-pass filter 120A includes first capacitive elements C21, C22, and C23 provided in the path 107, an inductor L21 provided between the path 107 and the ground, and a second capacitive element C24 connected in parallel with the inductor L21. The first capacitive elements C21 and C22 are provided in series in the path 107. The first capacitive element C23 is provided in parallel with the path 107.

The configuration of the high-pass filter 120B is the same as the configuration of the high-pass filter 120A. Specifically, the high-pass filter 120B includes first capacitive elements C25, C26, and C27 provided in the path 107, an inductor L22 provided between the path 107 and the ground, and a second capacitive element C28 connected in parallel with the inductor L22. The first capacitive elements C25 and C26 are provided in series in the path 107. The first capacitive element C27 is provided in parallel with the path 107.

A detailed description will now be given of a relationship of connection of a plurality of components constituting the branching filter 101, with reference to FIG. 8. First, the band-pass filter 110 (low-pass filter 110A and high-pass filters 110B and 110C) will be described. One end of the inductor L11 is connected to the common port 102. The capacitive element C11 is connected in parallel with the inductor L11. One end of the capacitive element C12 is connected to the other end of the inductor L11. The other end of the capacitive element C12 is connected to the ground.

One end of the first capacitive element C13 is connected to the other end of the inductor L11. One end of the first capacitive element C14 is connected to the other end of the first capacitive element C13. One end of the first capacitive element C15 is connected to the one end of the first capacitive element C13. The other end of the first capacitive element C15 is connected to the other end of the first capacitive element C14.

One end of the inductor L12 is connected to a connection point between the first capacitive element C13 and the first capacitive element C14. The other end of the inductor L12 is connected to the ground. The second capacitive element C16 is connected in parallel with the inductor L12.

One end of the first capacitive element C17 is connected to the other end of the first capacitive element C14. One end of the first capacitive element C18 is connected to the other end of the first capacitive element C17. The other end of the first capacitive element C18 is connected to the signal port 103. One end of the first capacitive element C19 is connected to the one end of the first capacitive element C17. The other end of the first capacitive element C19 is connected to the other end of the first capacitive element C18.

One end of the inductor L13 is connected to a connection point between the first capacitive element C17 and the first capacitive element C18. The other end of the inductor L13 is connected to the ground. The second capacitive element C20 is connected in parallel with the inductor L13.

In FIG. 8, the first capacitive elements C13 to C15 are connected in delta ($\Delta$) connection. By converting the connection of the first capacitive elements C13 to C15 from the delta ($\Delta$) connection to star (Y) connection, a first serial circuit constituted by capacitors corresponding to the first capacitive elements and the inductor L12 is formed between the path 106 and the ground. Each of the resonance frequency of the first serial circuit and the resonance frequency of a first parallel circuit constituted by the inductor L12 and the second capacitive element C16 is set at a predetermined value according to design values, such as the passband, of the band-pass filter 110. The resonance frequency of the first serial circuit and the resonance frequency of the first parallel circuit may be different from each other. The resonance frequency of the first parallel circuit may be higher than the resonance frequency of the first serial circuit.

Similarly, in FIG. 8, the first capacitive elements C17 to C19 are connected to each other in the delta ($\Delta$) connection. By converting the connection of the first capacitive elements C17 to C19 from the delta ($\Delta$) connection to the star (Y) connection, a second serial circuit constituted by capacitors corresponding to the first capacitive elements and the inductor L13 is formed between the path 106 and the ground. Each of the resonance frequency of the second serial circuit and the resonance frequency of the second parallel circuit constituted by the inductor L13 and the second capacitive element C20 is set at a predetermined value according to design values, such as the passband, of the band-pass filter 110. The resonance frequency of the second serial circuit and the resonance frequency of the second parallel circuit may be different from each other. The resonance frequency of the second parallel circuit may be higher than the resonance frequency of the second serial circuit.

Next, the high-pass filter 120 (high-pass filters 120A and 120B) will be described. One end of the first capacitive element C21 is connected to the common port 102. One end of the first capacitive element C22 is connected to the other end of the first capacitive element C21. One end of the first capacitive element C23 is connected to the one end of the first capacitive element C21. The other end of the first capacitive element C23 is connected to the other end of the first capacitive element C22.

One end of the inductor L21 is connected to a connection point between the first capacitive element C21 and the first capacitive element C22. The other end of the inductor L21 is connected to the ground. The second capacitive element C24 is connected in parallel with the inductor L21.

One end of the first capacitive element C25 is connected to the other end of the first capacitive element C22. One end of the first capacitive element C26 is connected to the other end of the first capacitive element C25. The other end of the first capacitive element C26 is connected to the signal port 104. One end of the first capacitive element C27 is connected to the one end of the first capacitive element C25. The other end of the first capacitive element C27 is connected to the other end of the first capacitive element C26.

One end of the inductor L22 is connected to a connection point between the first capacitive element C25 and the first capacitive element C26. The other end of the inductor L22 is connected to the ground. The second capacitive element C28 is connected in parallel with the inductor L22.

In FIG. 8, the first capacitive elements C21 to C23 are connected in the delta ($\Delta$) connection. By converting the connection of the first capacitive elements C21 to C23 from the delta ($\Delta$) connection to the star (Y) connection, a third serial circuit constituted by capacitors corresponding to the first capacitive elements and the inductor L21 is formed between the path 107 and the ground. Each of the resonance frequency of the third serial circuit and the resonance frequency of a third parallel circuit constituted by the inductor L21 and the second capacitive element C24 is set at a predetermined value according to design values, such as the cutoff frequency and the passband, of the high-pass filter 120. The resonance frequency of the third serial circuit and the resonance frequency of the third parallel circuit may be different from each other. The resonance frequency of the third parallel circuit may be higher than the resonance frequency of the third serial circuit.

Similarly, in FIG. 8, the first capacitive elements C25 to C27 are connected to each other in the delta ($\Delta$) connection. By converting the connection of the first capacitive elements C25 to C27 from the delta ($\Delta$) connection to the star (Y) connection, a fourth serial circuit constituted by capacitors corresponding to the first capacitive elements and the inductor L22 is formed between the path 107 and the ground. Each of the resonance frequency of the fourth serial circuit and the resonance frequency of a fourth parallel circuit constituted by the inductor L22 and the second capacitive element C28 is set at a predetermined value according to design values, such as the cutoff frequency and the passband, of the high-pass filter 120. The resonance frequency of the fourth serial circuit and the resonance frequency of the fourth parallel circuit may be different from each other. The resonance frequency of the fourth parallel circuit may be higher than the resonance frequency of the fourth serial circuit.

Figure 9:
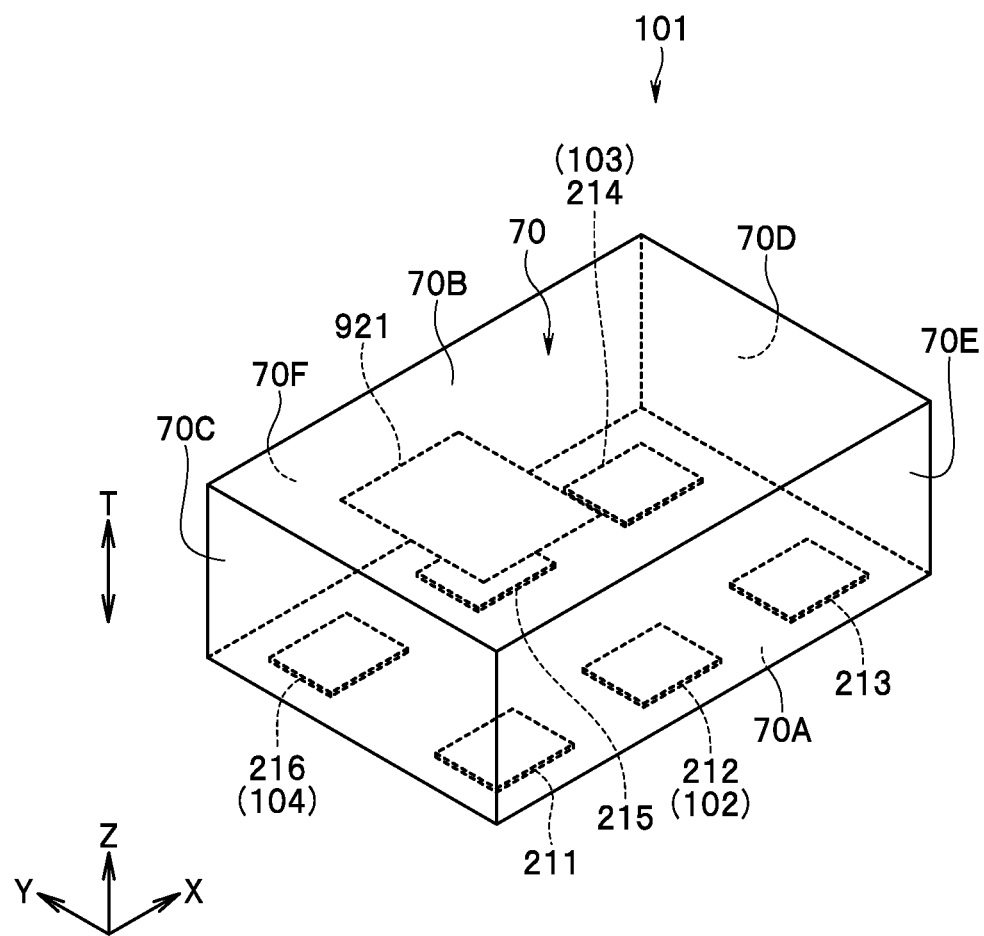
FIG. 9 is a perspective view showing an external appearance of a branching filter in the second embodiment of the present invention.

Next, other configurations of the branching filter 101 will be described with reference to FIG. 9. FIG. 9 is a perspective view showing an external appearance of the branching filter

101. The branching filter 101 further includes a stack 70 including a plurality of dielectric layers and a plurality of conductor layers stacked together. The common port 102, the signal ports 103 and 104, the band-pass filter 110 (low-pass filter 110A and high-pass filter 110B), and the high-pass filter 120 (high-pass filters 120A and 120B) shown in FIG. 8 are integrated with the stack 70.

The stack 70 has a bottom surface 70A and a top surface 70B located at both ends in a stacking direction T of the plurality of dielectric layers, and four side surfaces 70C to 70F connecting the bottom surface 70A and the top surface 70B. The side surfaces 70C and 70D are opposite to each other. The side surfaces 70E and 70F are opposite to each other. The side surfaces 70C to 70F are perpendicular to the top surface 70B and the bottom surface 70A.

As shown in FIG. 9, the bottom surface 70A is located at the end of the stack 70 in the −Z direction. The top surface 70B is located at the end of the stack 70 in the Z direction. The bottom surface 70A and the top surface 70B each have a rectangular shape extending in the X direction. The side surface 70C is located at the end of the stack 70 in the −X direction. The side surface 70D is located at the end of the stack 70 in the X direction. The side surface 70E is located at the end of the stack 70 in the —Y direction. The side surface 70F is located at the end of the stack 70 in the Y direction.

The branching filter 101 further includes six terminals 211, 212, 213, 214, 215, and 216 provided on the bottom surface 70A of the stack 70. The terminals 211, 212, and 213 are arranged in this order in the X direction at positions closer to the side surface 70E than the side surface 70F. The terminals 214, 215, and 216 are arranged in this order in the −X direction at positions closer to the side surface 70F than the side surface 70E.

The terminal 212 corresponds to the common port 102, the terminal 214 corresponds to the signal port 103, and the terminal 216 corresponds to the signal port 104. The common port 102 and the signal ports 103 and 104 are thus provided on the bottom surface 70A of the stack 70. The terminals 211, 213, and 215 are connected to the ground.

Next, an example of the plurality of dielectric layers and the plurality of conductor layers constituting the stack 70 will be described with reference to FIG. 10A to FIG. 14. In this example, the stack 70 includes twenty-two dielectric layers stacked together. In the following, the twenty-two dielectric layers will be referred to as the first to twenty-second dielectric layers in the order from bottom to top. The first to twenty-second dielectric layers will be denoted by the reference numerals 71 to 92.

In FIG. 10A to FIG. 13B, each of a plurality of circles represents a through hole. The dielectric layers 71 to 90 each have a plurality of through holes. The plurality of through holes are each formed by filling a hole intended for a through hole with a conductive paste. Each of the plurality of through holes is connected to a conductor layer or another through hole.

Figure 10A:
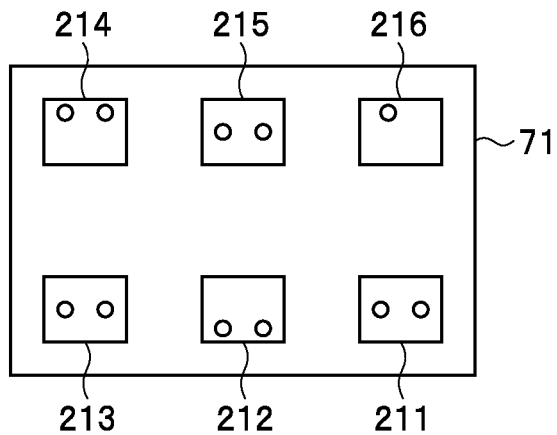
FIG. 10A to FIG. 10C are explanatory diagrams showing respective patterned surfaces of first to third dielectric layers of a stack of the branching filter in the second embodiment of the present invention.
Figure 10B:
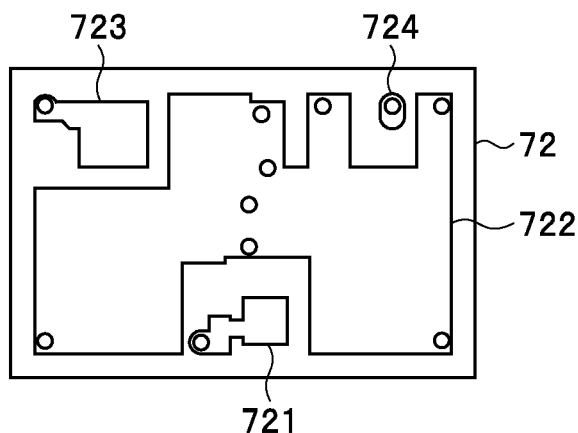

FIG. 10A shows the patterned surface of the first dielectric layer 71. The terminals 211 to 216 are formed on the patterned surface of the dielectric layer 71. FIG. 10B shows the patterned surface of the second dielectric layer 72. Conductor layers 721, 722, 723, and 724 are formed on the patterned surface of the dielectric layer 72.

Figure 10C:
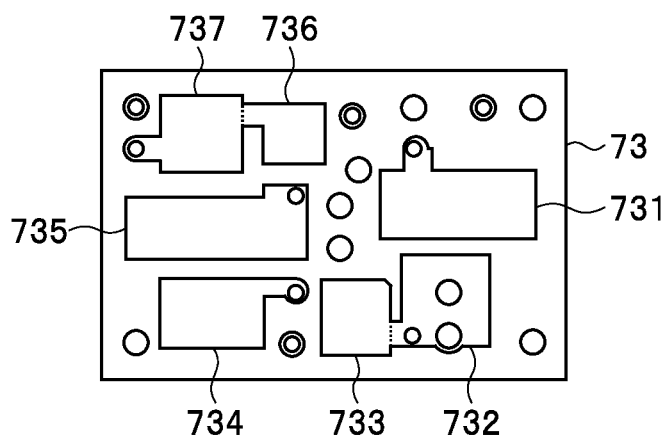

FIG. 10C shows the patterned surface of the third dielectric layer 73. Conductor layers 731, 732, 733, 734, 735, 736, and 737 are formed on the patterned surface of the dielectric layer 73. The conductor layer 732 is connected to the conductor layer 733. The conductor layer 736 is connected to the conductor layer 737. In FIG. 10C, each of the boundary between the conductor layer 732 and the conductor layer 733 and the boundary between the conductor layer 736 and the conductor layer 737 is indicated by a dotted line.

Figure 11A:
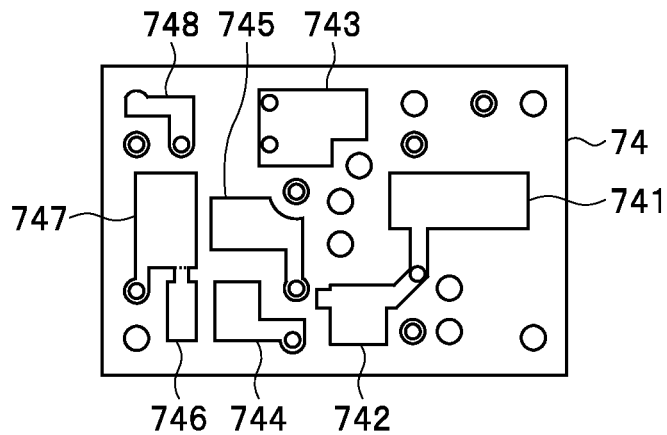
FIG. 11A to FIG. 11C are explanatory diagrams showing respective patterned surfaces of fourth to sixth dielectric layers of the stack of the branching filter in the second embodiment of the present invention.

FIG. 11A shows the patterned surface of the fourth dielectric layer 74. Conductor layers 741, 742, 743, 744, 745, 746, 747, and 748 are formed on the patterned surface of the dielectric layer 74. The conductor layer 741 is connected to the conductor layer 742. The conductor layer 746 is connected to the conductor layer 747. In FIG. 11A, the boundary between the conductor layer 746 and the conductor layer 747 is indicated by a dotted line.

Figure 11B:
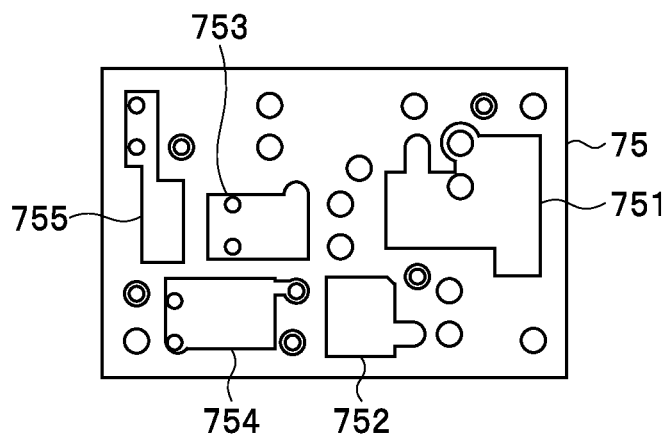
Figure 11C:
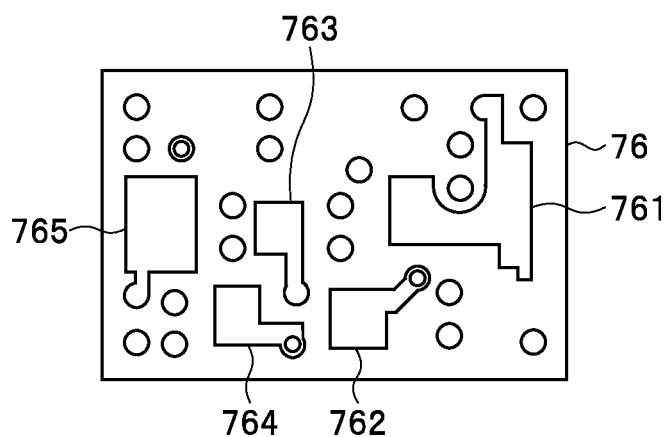

FIG. 11B shows the patterned surface of the fifth dielectric layer 75. Conductor layers 751, 752, 753, 754, and 755 are formed on the patterned surface of the dielectric layer 75. FIG. 11C shows the patterned surface of the sixth dielectric layer 76. Conductor layers 761, 762, 763, 764, and 765 are formed on the patterned surface of the dielectric layer 76.

Figure 12A:
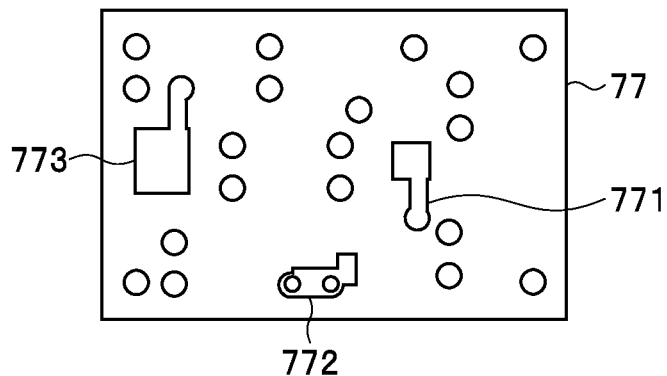
FIG. 12A is an explanatory diagram showing a patterned surface of a seventh dielectric layer of the stack of the branching filter in the second embodiment of the present invention.
Figure 12B:
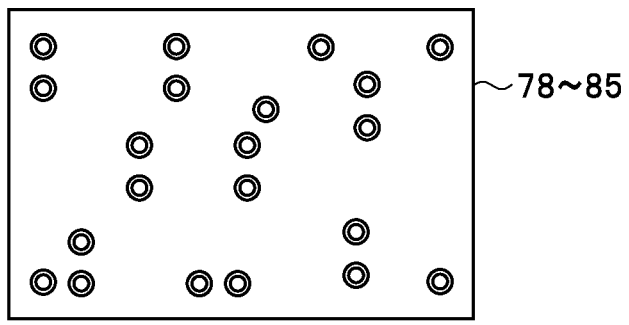
FIG. 12B is an explanatory diagram showing respective patterned surfaces of eighth to fifteenth dielectric layers of the stack of the branching filter in the second embodiment of the present invention.

FIG. 12A shows the patterned surface of the seventh dielectric layer 77. Conductor layers 771, 772, and 773 are formed on the patterned surface of the dielectric layer 77. FIG. 12B shows the patterned surface of each of the eighth to fifteenth dielectric layers 78 to 85. No conductor layer is formed on the patterned surface of each of the dielectric layers 78 to 85.

Figure 12C:
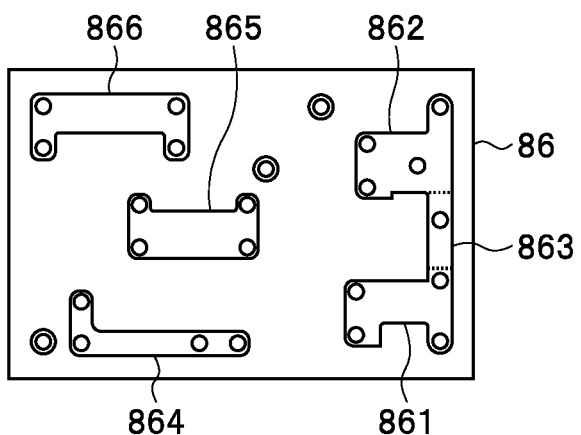
FIG. 12C is an explanatory diagram showing a patterned surface of a sixteenth dielectric layer of the stack of the branching filter in the second embodiment of the present invention.

FIG. 12C shows the patterned surface of the sixteenth dielectric layer 86. Inductor conductor layers 861, 862, 864, 865, and 866 and the conductor layer 863 are formed on the patterned surface of the dielectric layer 86. The conductor layer 861 and 862 are connected to the conductor layer 863. In FIG. 12C, each of the boundary between the conductor layer 861 and the conductor layer 863 and the boundary between the conductor layer 862 and the conductor layer 863 is indicated by a dotted line.

Figure 13A:
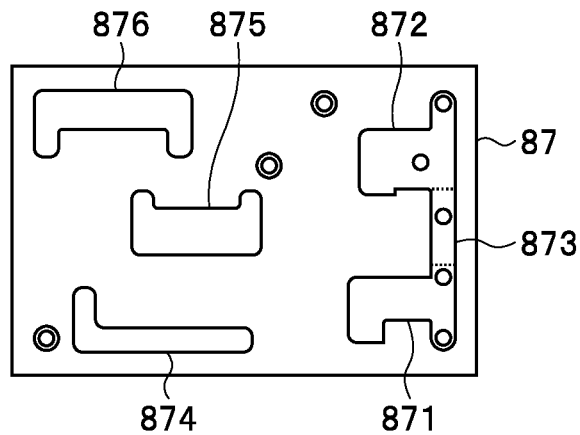
FIG. 13A to FIG. 13C are explanatory diagrams showing respective patterned surfaces of seventeenth to twenty-first dielectric layers of the stack of the branching filter in the second embodiment of the present invention.

FIG. 13A shows the patterned surface of the seventeenth dielectric layer 87. Inductor conductor layers 871, 872, 874, 875, and 876 and the conductor layer 873 are formed on the patterned surface of the dielectric layer 87. The conductor layers 871 and 872 are connected to the conductor layer 873. In FIG. 13A, each of the boundary between the conductor layer 871 and the conductor layer 873 and the boundary between the conductor layer 872 and the conductor layer 873 is indicated by a dotted line.

Figure 13B:
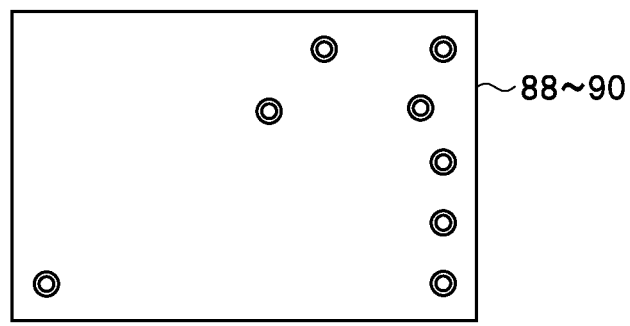
Figure 13C:
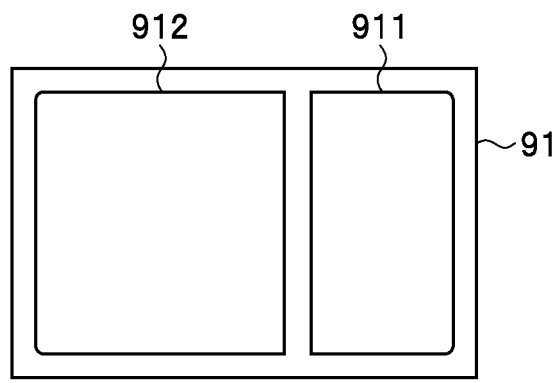

FIG. 13B shows the patterned surface of each of the eighteenth to twentieth dielectric layers 88 to 90. No conductor layer is formed on each of the dielectric layers 88 to 90. FIG. 13C shows the patterned surface of the twenty-first dielectric layer 91. Ground conductor layers 911 and 912 are formed on the patterned surface of the dielectric layer 91.

Figure 14:
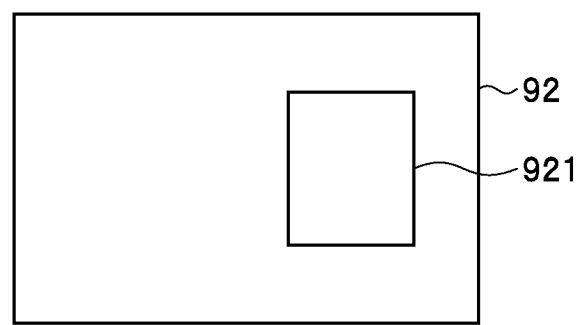
FIG. 14 is an explanatory diagram showing a patterned surface of a twenty-second dielectric layer of the stack of the branching filter in the second embodiment of the present invention.

FIG. 14 shows the patterned surface of the twenty-second dielectric layer 92. A mark 921 made of a conductor layer is formed on the patterned surface of the dielectric layer 92.

The stack 70 shown in FIG. 9 is formed by stacking the first to twenty-second dielectric layers 71 to 92 such that the patterned surface of the first dielectric layer 71 serves as the bottom surface 70A of the stack 70 and the surface of the twenty-second dielectric layer 92 opposite to the patterned surface thereof serves as the top surface 70B of the stack 70.

Each of the plurality of through holes shown in FIG. 10A to FIG. 13B is connected to, when the first to twenty-second dielectric layers 71 to 92 are stacked, a conductor layer overlapping in the stacking direction T or to another through hole overlapping in the stacking direction T. Of the plurality of through holes shown in FIG. 10A to FIG. 13B, the ones located within a terminal or a conductor layer are connected to the terminal or conductor layer.

Figure 15:
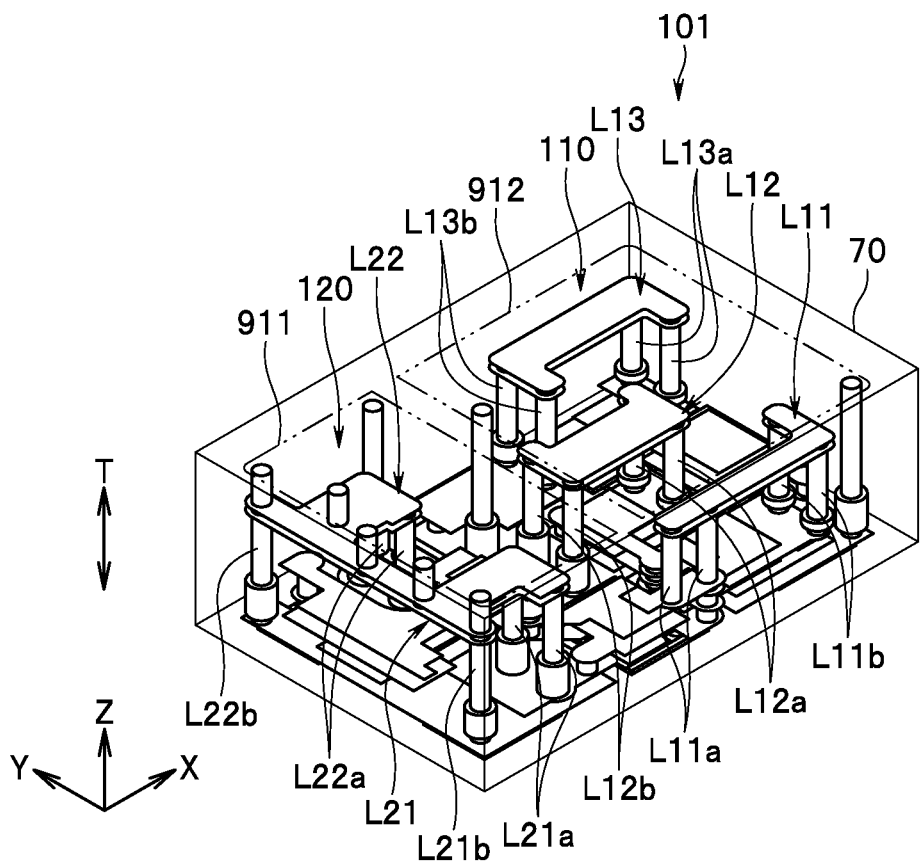
FIG. 15 is a perspective view showing an internal structure of the stack of the branching filter in the second embodiment of the present invention.

FIG. 15 shows the internal structure of the stack 70 formed by stacking the first to twenty-second dielectric layers 71 to 92. As shown in FIG. 15, the plurality of conductor layers and the plurality of through holes shown in FIG. 10A to 13C are stacked inside the stack 70. Note that FIG. 15 omits the mark 921.

Correspondences between the components of the branching filter 101 shown in FIG. 8 and the internal components of the stack 70 shown in FIG. 10A to FIG. 13C will now be described. First, components of the band-pass filter 110 will be described. The inductor L11 is constituted by the inductor conductor layers 864 and 874, and the plurality of through holes connected to those conductor layers. The capacitive element C11 is constituted by the conductor layers 734, 744, 754, and 764, and the dielectric layers 73 to 75 interposed between those conductor layers. The capacitive element C12 is constituted by the conductor layers 722 and 734, and the dielectric layer 72 interposed between those conductor layers.

The inductor L12 is constituted by the inductor conductor layers 865 and 875, and the plurality of through holes connected to those conductor layers. The first capacitive element C13 is constituted by the conductor layers 735, 745, 753, and 763, and the dielectric layers 73 to 75 interposed between those conductor layers. The first capacitive element C14 is constituted by the conductor layers 735 and 747, and the dielectric layer 73 interposed between those conductor layers. The first capacitive element C15 is constituted by the conductor layers 746 and 754, and the dielectric layer 74 interposed between those conductor layers. The second capacitive element C16 is constituted by the conductor layers 722 and 735, and the dielectric layer 72 interposed between those conductor layers.

The inductor L13 is constituted by the conductor layers 866 and 876, and the plurality of through holes connected to those conductor layers. The first capacitive element C17 is constituted by the conductor layers 747, 755, and 765, and the dielectric layers 74 and 75 interposed between those conductor layers. The first capacitive element C18 is constituted by the conductor layers 723 and 737, and the dielectric layer 72 interposed between those conductor layers. The first capacitive element C19 is constituted by the conductor layers 765 and 773, and the dielectric layer 76 interposed between those conductor layers. The second capacitive element C20 is constituted by the conductor layers 722, 736, and 743, and the dielectric layers 72 and 73 interposed between those conductor layers.

Next, components of the high-pass filter 120 will be described. The inductor L21 is constituted by the inductor conductor layers 861 and 871, and the plurality of through holes connected to those conductor layers. The first capacitive element C21 is constituted by the conductor layers 721 and 733, and the dielectric layer 72 interposed between those conductor layers. The first capacitive element C22 is constituted by the conductor layers 733, 742, 752, and 762, and the dielectric layers 73 to 75 interposed between those conductor layers. The first capacitive element C23 is constituted by the conductor layers 762 and 772, and the dielectric layer 76 interposed between those conductor layers. The second capacitive element C24 is constituted by the conductor layers 722 and 732, and the dielectric layer 72 interposed between those conductor layers.

The inductor L22 is constituted by the inductor conductor layers 862 and 872, and the plurality of through holes connected to those conductor layers. The first capacitive element C25 is constituted by the conductor layers 741 and 751, and the dielectric layer 74 interposed between those conductor layers. The first capacitive element C26 is constituted by the conductor layers 751 and 761, and the dielectric layer 75 interposed between those conductor layers. The first capacitive element C27 is constituted by the conductor layers 761 and 771, and the dielectric layer 76 interposed between those conductor layers. The second capacitive element C28 is constituted by the conductor layers 722 and 731 and the dielectric layer 72 interposed between those conductor layers.

Next, structural features of the branching filter 101 will be described with reference to FIG. 9 to FIG. 15. The band-pass filter 110 and the high-pass filter 120 are arranged in a longitudinal direction of the bottom surface 70A or the top surface 70B, i.e., a direction parallel to the X direction. The side surfaces 70C and 70D of the stack 70 are located at both ends of a direction that is orthogonal to the stacking direction T and is parallel to the X direction. The band-pass filter 110 is arranged at a position closer to the side surface 70D than the side surface 70C. The high-pass filter 120 is arranged at a position closer to the side surface 70C than the side surface 70D.

As shown in FIG. 15, the inductors L11 to L13, L21, and L22 are each wound about an axis extending in a direction that is orthogonal to the stacking direction T and is in parallel with the Y direction.

The stack 70 includes two first through hole lines L11a, two first through hole lines L12a, two first through hole lines L13a, two first through hole lines L21a, two first through hole lines L22a, two second through hole lines L11b, two second through hole lines L12b, two second through hole lines L13b, one second through hole line L21b, and one second through hole line L22b.

The inductor conductor layer 861 connects one ends of the two first through hole lines L21a and one end of the one second through hole line L21b. The inductor conductor layer 862 connects one ends of the two first through hole lines L22a and one end of the one second through hole line L22b.

The inductor conductor layer 864 connects one ends of the two first through hole lines L11a and one ends of the two second through hole lines L11b. The inductor conductor layer 865 connects one ends of the two first through hole lines L12a and one ends of the two second through hole lines L12b. The inductor conductor layer 866 connects one ends of the two first through hole lines L13a and one ends of the two second through hole lines L13b.

The inductor L11 is constituted by the inductor conductor layers 864 and 874, the two first through hole lines L11a, the two second through hole lines L11b, and the four through holes connected to both the inductor conductor layers 864 and 874. The inductor L12 is constituted by the inductor conductor layers 865 and 875, the two first through hole lines L12a, the two second through hole lines L12b, and the four through holes connected to both the inductor conductor layers 865 and 875. The inductor L13 is constituted by the inductor conductor layers 866 and 876, the two first through hole lines L13a, the two second through hole lines L13b, and the four through holes connected to both of the inductor conductor layers 866 and 876.

The inductor L21 is constituted by the inductor conductor layers 861 and 871, the two first through hole lines L21a, the one second through hole line L21b, and the three through holes connected to both the inductor conductor layers 861 and 871. The inductor L22 is constituted by the inductor conductor layers 862 and 872, the two first through hole lines L22a, the one second through hole line L22b, and the three through holes connected to both the inductor conductor layers 862 and 872.

The conductor layers 721 to 723, 731 to 737, 741 to 748, 751 to 755, 761 to 765, 771, and 773 correspond to the "capacitor conductor layers" in the present invention.

The configuration, operation, and effects of the present embodiment are otherwise the same as those of the first embodiment.

The present invention is not limited to the foregoing embodiments, and various modifications may be made thereto. For example, a filter of the present invention may include only one high-pass filter or may include three or more high-pass filters.

Obviously, many modifications and variations of the present invention are possible in the light of the above teachings. Thus, the present invention may be practiced in other embodiments than the foregoing most preferable embodiments within the scope of the appended claims and equivalents thereof

What is claimed is:

1. A filter comprising:
a first port;
a second port; and
at least one high-pass filter provided between the first port and the second port in a circuit configuration, wherein
the at least one high-pass filter includes a three first capacitive elements connected to a path connecting the first port and the second port, the three first capacitive elements being connected to one another, an inductor provided between the path and ground, and a second capacitive element connected in parallel with the inductor,
wherein a first resonance frequency of a circuit including the inductor and at least one capacitor that corresponds to the three first capacitive elements and a second resonance frequency of a circuit including the inductor and the second capacitive element are different from each other.

2. The filter according to claim 1, further comprising a low-pass filter provided between the first port or the second port and the at least one high-pass filter in a circuit configuration.

3. The filter according to claim 1, wherein the second resonance frequency is higher than the first resonance frequency.

4. The filter according to claim 1, wherein the at least one high-pass filter includes a plurality of high-pass filters.

5. The filter according to claim 1, further comprising a stack including a plurality of dielectric layers and a plurality of conductor layers stacked together, wherein
the first port, the second port, and the at least one high-pass filter are integrated with the stack.

6. The filter according to claim 5, wherein
the at least one high-pass filter includes a first high-pass filter and a second high-pass filter,
the stack includes a first side surface and a second side surface located at both two ends in a direction orthogonal to a stacking direction of the plurality of dielectric layers,
the inductor of the first high-pass filter is arranged at a position closer to the first side surface than the second side surface, and
the inductor of the second high-pass filter is arranged at a position closer to the second side surface than the first side surface.

7. The filter according to claim 5, wherein the plurality of conductor layers include a plurality of capacitor conductor layers for constituting the three first capacitive elements and the second capacitive element.

8. The filter according to claim 5, wherein the inductor is wound about an axis orthogonal to the plurality of dielectric layers.

9. The filter according to claim 8, wherein
the stack further includes at least one first through hole line and at least one second through hole line,
each of the at least one first through hole line and the at least one second through hole line is constituted by two or more through holes connected in series to each other,
the plurality of conductor layers include an inductor conductor layer connecting one end of the at least one first through hole line and one end of the at least one second through hole line, and
the inductor is constituted by the inductor conductor layer, the at least one first through hole line, and the at least one second through hole line.

10. The filter according to claim 9, wherein
the at least one first through hole line includes two first through hole lines, and
the at least one second through hole line includes two second through hole lines.

* * * * *